TRANSISTOR AMPLIFIER CIRCUITS

Filed July 26, 1955

INVENTOR.
FREDERICK D. WALDHAUER
BY H. L. Newton
ATTORNEY

United States Patent Office 2,839,620

Patented June 17, 1958

2,839,620

TRANSISTOR AMPLIFIER CIRCUITS

Frederick D. Waldhauer, Haddonfield, N. J., assignor to Radio Corporation of America, a corporation of Delaware Application July 26, 1955, Serial No. 524,477

11 Claims. (Cl. 179—171)

Figure 1:
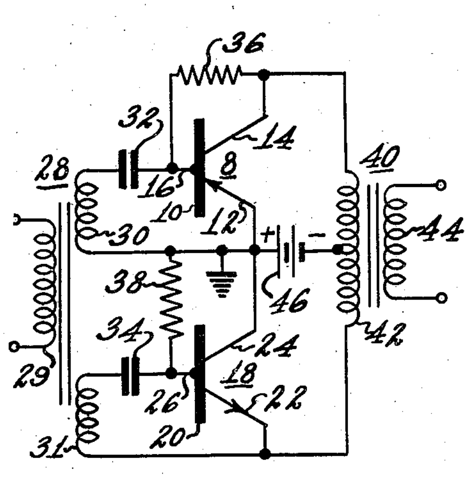

This invention relates to signal amplifier circuits connected to provide push-pull signal amplifying operation, and in particular to transistor signal amplifier circuits of that type.

Vacuum tubes and transistors connected to provide push-pull signal operation have been used extensively, particularly where increased power output with low signal distortion is desired or required. Generally, two methods have been used to provide the circuit connections for accomplishing this type of operation, each of which has certain advantages. In one type, the tubes or transistors are arranged in series for the direct current components and in parallel for the signal. This is referred to as a "push-pull single-ended" amplifier. In the case of tube push-pull single-ended amplifiers, a balanced driving source is required so that a phase inverting circuit or input transformer is needed.

Transistors, however, may be opposite conductivity or complementary symmetry types. Thus, a transistor of N-type conductivity has a symmetrical conduction characteristic when compared with a transistor of P-type conductivity. The symmetrical properties of transistors, for which there is no tube counterpart, are more fully described by George C. Sziklai in the June 1953 issue of the Proceedings of the I. R. E., pages 717–724. Since the symmetrical properties of opposite conductivity transistors give rise to an opposite output effect from a given input condition, push-pull amplification is possible and an amplified single-ended output signal may be derived from a single-ended input signal.

The second type push-pull circuit, which is often preferred for some circuit applications, is generally referred to as a "balanced push-pull" amplifier. In this type of amplifier, a pair of tubes or a pair of transistors of the same conductivity type are connected so that the two halves of the output transformer primary winding are in parallel for the direct current components and in series for the signal. In this type circuit, a balanced driving source is required. A phase inverting circuit or input transformer is, therefore, provided.

It is an object of the present invention, therefore, to provide an improved signal amplifier circuit for obtaining balanced push-pull signal amplifying operation utilizing opposite conductivity type transistors.

It is another object of the present invention to provide an improved amplifier circuit wherein opposite conductivity type transistors are utilized for obtaining balanced operation without the need of a balanced driving source.

These and further objects and advantages of the present invention are achieved in a circuit arrangement utilizing a pair of opposite conductivity type transistors connected so that an input signal may simultaneously be applied to the input electrodes of the transistors. To derive a push-pull output signal from the circuit, a balanced output circuit is connected between the output electrodes to define a signal conveying series path with the output electrodes and a third electrode of the transistors. To properly bias the transistors for signal amplifying operation, a source of potential is provided which is connected in parallel with the series signal conveying path for applying biasing potentials to the output electrodes through the output circuit.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figures 1, 2, 3 and 4 are schematic circuit diagrams of balanced push-pull signal amplifier circuits utilizing opposite conductivity type transistors and illustrating various embodiments of the present invention.

Referring now to the drawing, wherein like parts are indicated by like reference numerals throughout the figures, and referring particularly to Figure 1, a push-pull amplifier circuit includes a pair of transistors 8 and 18 of opposite conductivity types. For purposes of illustration, the transistor 8 may be considered to be a junction transistor of the P–N–P type, while the transistor 18 may be considered to be a junction transistor of the N–P–N type. Alternatively, the transistor 8 could be of P type conductivity, in which case the transistor 18 would be of N type conductivity. For such a change, the polarity of the biasing voltages would also have to be reversed. In addition, the invention is in no way restricted to junction transistors and other types could be used. Each of the transistors comprises a semi-conductive body with which three electrodes are cooperatively associated in a well known manner. Thus the transistor 8 includes a semi-conductive body 10 and an emitter 12, a collector 14 and a base 16. The transistor 18 also includes a semi-conductive body 20 and an emitter 22, a collector 24 and a base 26.

For applying input signals to the circuit in the embodiment of the invention illustrated in Figure 1, an input transformer 28 is provided which includes a primary winding 29 and a pair of secondary windings 30 and 31. One end of the first secondary winding 30 is coupled through a coupling capacitor 32 to the base 16 of the P–N–P transistor 8, while the other end of the winding 30 is connected to the emitter 12, which is connected as shown to a point of reference potential or system ground. Accordingly, the transistor 8 operates as a grounded or common emitter stage, the input signal being applied between the base and emitter, the base being referred to thereby as the input electrode and the emitter as the common electrode.

The upper end of the second secondary winding 31 is coupled through a coupling capacitor 34 to the base 26 of the N–P–N transistor 18. The other end of the second secondary winding 31 is connected directly with the emitter 22 of the transistor 18. The collector 24 of the transistor 18 is returned directly to ground as shown. Thus, input signals are applied between the base 26 and the emitter 22 of the transistor 18, the emitter 22 also serving as the output electrode. The emitter is thus common to both the input and output circuits and may be referred to as the common electrode, the base being the input electrode. Stability of the circuit operation is improved by connecting a first resistor 36 between the collector 14 and the base 16 of the transistor 8 and a second resistor 38 between the collector of the transistor 18 and its base 26.

To provide a balanced push-pull output circuit for the transistors 8 and 18, a transformer 40 is provided, the primary winding 42 of which is connected in series between the output electrodes of the transistors 8 and 18, such that a signal conductive series path is provided which includes the output electrodes of each of the transistors, namely the collector 14 and the emitter 22, the primary winding 42, the collector 24 of the N–P–N transistor 18 and the emitter 12 of the P–N–P transistor 8. A push-pull output signal may be derived from across the secondary winding 44 of the output transformer 40.

To properly bias the transistors 8 and 18, a source of direct current potential such as illustrated by a battery 46 is connected so as to apply direct current potentials to the collector 14 of the transistor 8 and the emitter 22 of the transistor 18 in parallel with the output circuit. To accomplish this, the positive terminal of the battery 46 is grounded, while its negative terminal is connected to a center tap on the primary winding 42 of the output transformer 40.

A push-pull amplifier of the type described may be operated as a class A, B or C amplifier by a suitable selection of the circuit parameters. In operation, the application of an input signal will have opposite effects on each of the transistors. Thus, the positive portion of the input signal, when applied to the base of the P–N–P transistor 8, will cause its collector output current to decrease. Conversely, the application of a positive signal to the base 26 of the N–P–N transistor 18 will cause its emitter or output current to increase. The application of the negative portion of the input signal will have the opposite effect on the transistors, the collector or output current of the transistor 18 increasing and the output current through the load, therefore, is the differential current and the effect on the output circuit is seen to be that of push-pull amplification.

Figure 2:
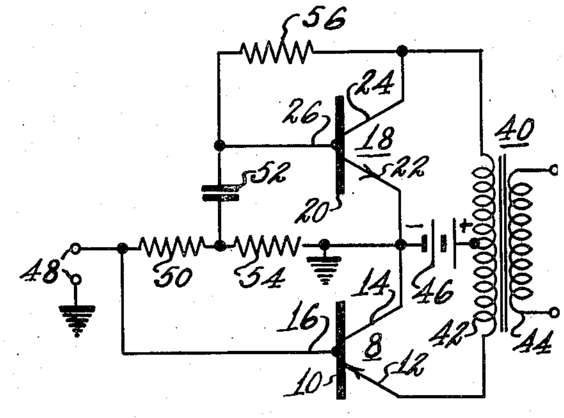

A push-pull amplifier circuit embodying the invention may also be driven from a single-ended source as shown in Figure 2, reference to which is now made. Input signals are applied to the circuit from a pair of input terminals 48, one of which is grounded. The ungrounded input terminal is connected directly with the base 16 of the P–N–P transistor 8. The P–N–P transistor 8, in this embodiment of the invention, has its collector 14 grounded, the collector 14 being common to the input and output circuits and the base 16 serving as an input electrode and the emitter 12 as an output electrode.

The ungrounded input terminal 48 is also connected through a resistor 50 and a coupling capacitor 52 to the base 26 of the N–P–N transistor 18. A resistor 54 is connected from the junction of the resistor 50 and the capacitor 52 to ground as shown and forms a voltage dividing network in combination with the resistor 50 in order that approximately equal signal current be applied to the base electrodes of each of the transistors 8 and 18. To stabilize the circuit operation and to reduce the voltage gain of the transistor 18, a resistor 56 is connected between the collector 24 and the base 26 of this transistor.

To provide a balanced output circuit for the amplifier, the primary winding 42 of the output transformer 40 is serially connected between the collector 24 of the N–P–N transistor 18 and the emitter 12 of the P–N–P transistor 8. Thus a series signal conveying path is provided which includes the emitter or common electrode 22 and the output or collector electrode 24 of the transistor 18, the primary winding 42, and the output or emitter electrode 12 and the common or collector electrode 14 of the P–N–P transistor 8. Biasing voltages are applied to the output electrodes of the transistors in parallel with this signal conveying path by connecting the negative terminal of the battery 46 to ground and its positive terminal to the center tap of the primary winding 42. In operation, the application of input signals to the input terminals 48 will result in the development of a push-pull output signal across the output circuit in much the same manner as described in connection with Figure 1.

Figure 3:
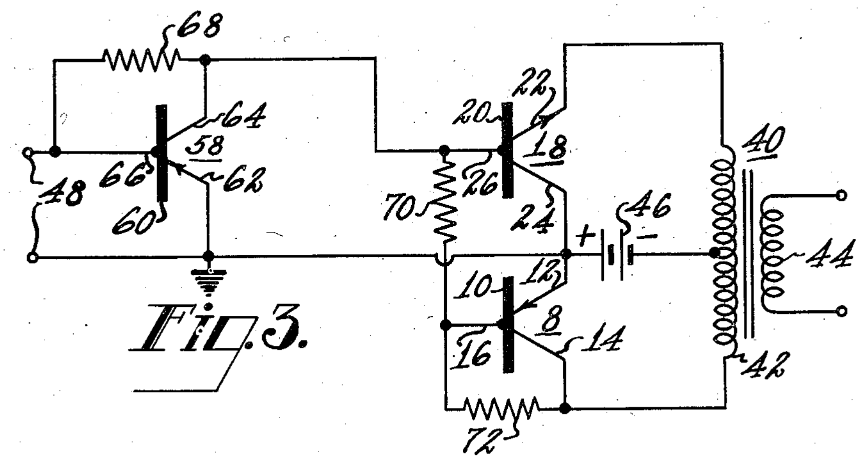

In Figure 3, reference to which is now made, a single transistor 58 is used as the driving source for a push-pull amplifier which is similar to the one illustrated in Figure 2. The transistor 58 may be considered to be a junction transistor of the P–N–P type and includes a semiconductive body 60 with which an emitter 62, a collector 64 and a base 66 are cooperatively associated. The transistor 58 could also be of P-type conductivity providing the polarity of the biasing potentials were reversed and need not be a junction transistor, other types being suitable for this application.

Input signals are applied to the driving transistor 58 between its base 66 and emitter 62 through the pair of input terminals 48, one of which is connected directly to the base 66 and the other of which is connected to the emitter 62 which is grounded as shown. A feedback stabilizing resistor 58 is connected directly between the collector 64 and the base 66 of the driver transistor 58.

The collector 64 of the driver transistor 58 is connected directly with the base 26 of the N–P–N transistor 18 and through a resistor 70 to the base 16 of the P–N–P transistor 8. In the embodiment of the invention illustrated in Figure 3, the N–P–N transistor 18 has its collector 24 grounded and its emitter electrode 22 serves as the output electrode. The emitter 22 is connected to one end of the primary winding 42 of the output transformer 40. The P–N–P transistor 8 is operated as a common emitter stage, its emitter 12 being connected to ground and its collector 14 being connected to the other end of the primary winding 42 and serving thereby as the output electrode. A series signal conveying path is thus defined which includes the collector 24 and the emitter 22 of the N–P–N transistor 18, the primary winding 42 and the collector 14 and the emitter 12 of the P–N–P transistor 8. Biasing potentials are applied to the transistors in parallel with this path through each half of the primary winding 42 by provision of the battery 46, the positive terminal of which is grounded and the negative terminal of which is connected to a center tap on the primary winding 42.

In order to equalize the transmission characteristics of the two output circuit transistors as to current gain and input and output impedance, a voltage feedback resistor 72 is provided which is connected between the collector 14 and the base 16 of the P–N–P transistor 8. The resistor 72 also provides bias currents for the base 11 of the transistor 8. In operation, input signals are applied at the input terminals 48, amplified by the transistor 58 and applied to the base electrodes 26 and 16 of the transistors 18 and 8, which are connected in push-pull as described. The circuit operation is then similar to that described in connection with the previous figures of the drawing to provide a balanced push-pull signal which may be derived across the secondary winding 44 of the output transformer 40.

Figure 4:
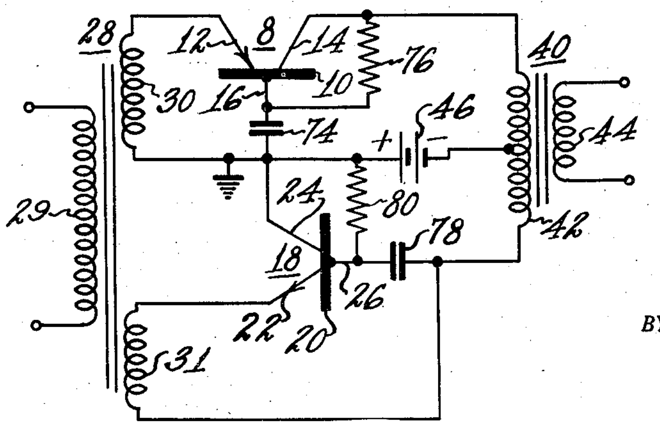

In Figure 4, reference to which is now made, the transistors 8 and 18 are each connected for common base operation, the emitter electrode in each case serving as the input electrode. Input signals are applied to the circuit through the input transformer 28, which has a primary winding 29 and a pair of secondary windings 30 and 31. The upper end of the first secondary winding 30 is connected to the emitter 12 of the transistor 10, while its lower end is connected to ground. The base 16 of the transistor 8 is coupled to ground through a capacitor 74, while its collector 14, which serves in this case as the output electrode, is connected to the upper end of the primary winding 32 of the output transformer 40 and through a feedback resistor 76 to the base 16.

The upper end of the second secondary winding 31 is connected directly to the emitter 22 and its lower end is connected to the lower end of the primary winding 42 of the output transformer 40. The N–P–N transistor 18 has its collector grounded, while its base is coupled through a capacitor 78 to the lower end of the primary winding 42. Accordingly, the base 26 is common to the input and output circuits of the amplifier. A feedback resistor 80 is connected between the base 26 and the collector 24 of the transistor 18. The collector 24 is connected directly to ground as shown. The output connection is such that a series signal conveying path is provided which includes the base 16 and the collector 14 of the P–N–P transistor 8, the primary winding 42 of the output transformer 40 and the base 26 and the collector 24 of the N–P–N transistor 18. Biasing potentials are applied in parallel with this path through each half of the secondary winding 42 by means of a battery 46, the positive terminal of which is grounded and the negative terminal of which is connected to a center tap on the primary winding 42. In a manner similar to the prior figures, an amplified push-pull output signal is thus developed which may be derived across a secondary winding 44 of the output transformer 40.

As described herein, push-pull signal amplifying operation is provided utilizing a pair of transistors of opposite conductivity types. By constructing signal amplifier circuits as described, a balanced input drive source is not needed and the push-pull transistors may be driven by a signal resistance-coupled transistor. Thus, circuit simplification, reliability and efficiency characterize the circuits embodying the invention, which may thus be used wherever push-pull signal amplification is desired or required.

What is claimed is:

1. In a push-pull signal amplifier, the combination with a pair of transistors of opposite conductivity types each including an input, an output and a third electrode, the input electrodes of said transistors being alike and the third electrode of each of said transistors being like the output electrode of the other transistor, of signal input means connected for simultaneously applying an input signal to the input electrodes of said transistors, means providing a balanced output circuit for deriving a push-pull output signal from said amplifier connected between said output electrodes and defining a signal conveying series path with the output and third electrodes of each of said transistors, and means connecting said pair of transistors in parallel for direct-current including a direct-current supply source having a pair of terminals, one of which is connected to a point of reference potential in said circuit and the other of which is connected to an intermediate point of said output circuit.

2. In a push-pull signal amplifier, the combination with a pair of transistors of opposite conductivity types each including a base, an emitter and a collector electrode, of signal input means connected for simultaneously applying an input signal to the base electrodes of said transistors, means providing a balanced output circuit for deriving a push-pull output signal from said amplifier connected between the collector electrode of one of said transistors and the emitter electrode of the other of said transistors and defining a signal conveying series path with the collector and emitter electrodes of each of said transistors, and means connecting said pair of transistors in parallel for direct-current including a direct-current supply source having a pair of terminals one of which is connected with the emitter of said one of said transistors and the collector of said other transistor and the other of which is connected to an intermediate point of said output circuit.

3. In a push-pull signal amplifier, the combination with a pair of transistors of opposite conductivity types each including a base, an emitter and a collector electrode, of signal input means connected for simultaneously applying an input signal to the emitter electrodes of said transistors, means providing a balanced output circuit for deriving a push-pull output signal from said amplifier connected between the collector electrode of one of said transistors and the base electrode of the other of said transistors and defining a signal conveying series path with the base and collector electrodes of each of said transistors, and means connecting said pair of transistors in parallel for direct-current including a direct-current supply source having a pair of terminals, one of which is connected to a point of reference potential in said circuit and the other of which is connected to an intermediate point of said output circuit for applying biasing potentials to the collector electrode of said one of said transistors and the emitter electrode of said other transistor.

4. In a push-pull signal amplifier, the combination comprising, a pair of transistors of opposite conductivity types each including a base, an emitter and a collector electrode, a signal input circuit connected for simultaneously applying an input signal to the base electrodes of said transistors, circuit means for connecting said transistors to provide push-pull signal amplifying operation including an output circuit connected between the collector electrode of one of said transistors and the emitter electrode of the other of said transistors and defining a signal conveying series path with the collector and emitter electrodes of each of said transistors, the emitter electrodes of each of said transistors being common to said signal input circuit and said output circuit, and means connecting said pair of transistors in parallel for direct-current including a direct-current supply source having a pair of terminals one of which is connected with the emitter of said one of said transistors and the collector of said other transistor and the other of which is connected to an intermediate point of said output circuit for applying biasing potentials to the collector electrode of said one of said transistors and the emitter electrode of said other transistor through said output circuit.

5. In a push-pull signal amplifier, the combination comprising, a pair of transistors of opposite conductivity types each including a base, an emitter and a collector electrode, a signal input circuit connected for simultaneously applying an input signal to the base electrodes of said transistors, circuit means for connecting said transistors to provide push-pull signal amplifying operation including an output circuit connected in series between the collector electrode of one of said transistors and the emitter electrode of the other of said transistors and defining a signal conveying series path with the collector and emitter electrodes of each of said transistors, the emitter electrode of said one of said transistors and the collector electrode of the other of said transistors being common to said signal input circuit and said output circuit, and means connecting said pair of transistors in parallel for direct-current including a direct-current supply source having a pair of terminals one of which is connected with the emitter of said one of said transistors and the collector of said other transistor and the other of which is connected to an intermediate point of said output circuit for applying biasing potentials to the collector electrode of said one of said transistors and the emitter electrode of said other transistor.

6. A push-pull signal amplifying circuit, comprising, in combination, a first transistor of one conductivity type including a first base, a first emitter and a first collector electrode, a second transistor of an opposite conductivity type including a second base, a second emitter and a second collector electrode, a signal input circuit coupled with said first and second base electrodes for simultaneously applying an input signal thereto, a signal output circuit connected between said first collector and said second emitter, means connecting said first emitter and said second collector to a common point of reference potential in said circuit, and means connecting said first and second transistors in parallel for direct-current including direct current supply means having a pair of terminals one of which is connected to a point of reference potential in said circuit and the other of which is connected to an intermediate point of said output circuit for applying energizing potentials to said first collector and said second emitter through said signal output circuit.

7. A push-pull signal amplifying circuit, comprising, in combination, a first transistor of one conductivity type including a first base, a first emitter and a first collector electrode, a second transistor of an opposite conductivity type including a second base, a second emitter and a second collector electrode, a signal input circuit coupled with said first and second emitter electrodes for simultaneously applying an input signal thereto, a signal output circuit serially connected between said first collector and said second base, means coupling said first base and said second collector to a common point of reference potential in said circuit, and means connecting said first and second transistors in parallel for direct-current including direct current supply means having a pair of terminals one of which is connected to said point of reference potential and the other of which the connected to an intermediate point of said output circuit for applying energizing potentials to said first collector and said second emitter through said signal output circuit.

8. In a push-pull signal amplifier circuit the combination with a first and a second input terminal, of means connecting said first input terminal to a point of reference potential in said circuit, a first transistor of one conductivity type including a first base, a first emitter and a first collector electrode, a second transistor of an opposite conductivity type including a second base, a second emitter and a second collector electrode, conductive circuit means coupling said first input terminal to said first and second base electrodes, means connecting said first emitter and said second collector to said point of reference potential, a signal output circuit connected between said first collector and said second emitter, and means connecting said first and second transistors in parallel for direct-current including direct current supply mean having a pair of terminals one of which is connected to said point of reference potential and the other of which is connected to an intermediate point of said output circuit for applying energizing potentials to said first collector and said second emitter.

9. In a push-pull signal amplifier circuit, the combination with a first and a second input terminal, of means connecting said first input terminal to a point of reference potential in said circuit, a first transistor of one conductivity type including a first base, a first emitter and a first collector electrode, a second transistor of an opposite conductivity type including a second base, a second emitter and a second collector electrode, means connecting said second input terminal with said second base electrode, voltage dividing means serially connected between said second input terminal and said point of reference potential, means coupling said first base with an intermediate point of said voltage dividing means whereby the signal which is applied to said first base is substantially equal to the signal which is applied to said second base, means connecting said first emitter and said second collector to said point of reference potential, a signal output circuit connected between said first collector and said second emitter, and means connecting said first and second transistors in parallel for direct-current including direct current supply means having a pair of terminals one of which is connected to said point of reference potential and the other of which is connected to an intermediate point of said output circuit for applying energizing potentials to said first collector and said second emitter.

10. In a signal amplifier circuit, the combination with a first transistor of one conductivity type including a first base, a first emitter and a first collector electrode, and a second transistor of an opposite conductivity type including a second base, a second emitter and a second collector electrode, of means providing an output circuit for deriving a push-pull output signal from said circuit connected between said first emitter and said second collector, a transistor amplifier for driving said first and second transistors and including an output electrode, means coupling said output electrode with said first and second base electrodes, and means connecting said first and second transistor in parallel for direct current including a direct-current supply source one of which is connected with said first collector and second emitter electrodes and the other of which is connected to an intermediate point of said output circuit for applying biasing potentials to said first emitter and said second collector.

11. In a signal amplifier circuit the combination with a first transistor of one conductivity type including a first base, a first emitter and a first collector electrode, and a second transistor of an opposite conductivity type including a second base, a second emitter and a second collector electrode, of means providing an output circuit for deriving a push-pull output signal from said circuit serially connected between said first emitter and said second collector, a driver transistor including a third base, a third emitter and a third collector electrode, means connecting said first collector and said second and third emitter electrodes to a point of reference potential in said circuit, signal input means connected for applying an input signal to said third base electrode, means coupling said third collector electrode to said first and second base electrodes, voltage feedback means coupled between said second collector and said second base, and means connecting said first and second transistors in parallel for direct-current including a direct-current supply source having a pair of terminals one of which is connected to said point of reference potential and the other of which is connected to an intermediate point of said output circuit for applying biasing potentials to said first emitter and said second collector.

References Cited in the file of this patent

Proceedings of the Institute of Radio Engineers, June 1953, pp. 717–724.